(12) United States Patent
Gong et al.

(10) Patent No.: US 9,330,849 B2
(45) Date of Patent: May 3, 2016

(54) NON-UNIFORM DIELECTRIC LAYER CAPACITOR FOR VIBRATION AND ACOUSTICS IMPROVEMENT

(71) Applicant: Apple Inc., Cupertino, CA (US)

(72) Inventors: Zhong-Qing Gong, Cupertino, CA (US); Kevin R. Richardson, Cupertino, CA (US); Yanchu Xu, Cupertino, CA (US); Connor R. Duke, Cupertino, CA (US); Benjamin A. Bard, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 69 days.

(21) Appl. No.: 14/285,461

(22) Filed: May 22, 2014

(65) Prior Publication Data

US 2015/0243440 A1 Aug. 27, 2015

Related U.S. Application Data

(60) Provisional application No. 61/943,173, filed on Feb. 21, 2014.

(51) Int. Cl.
*H01G 4/30* (2006.01)
*H01G 4/12* (2006.01)
*H05K 1/18* (2006.01)
*H01G 4/255* (2006.01)
(Continued)

(52) U.S. Cl.
CPC .......... *H01G 4/30* (2013.01); *H01G 4/005* (2013.01); *H01G 4/12* (2013.01); *H01G 4/255* (2013.01); *H05K 1/181* (2013.01); *H05K 3/3442* (2013.01); *H05K 2201/10015* (2013.01); *H05K 2201/2045* (2013.01); *Y10T 29/435* (2015.01)

(58) Field of Classification Search
CPC .......... H01G 4/30; H01G 4/12; H01G 4/005; H01G 4/255
USPC .......... 361/301.4, 301.2, 303–305, 306.1, 361/306.3, 321.1, 321.2
See application file for complete search history.

(56) References Cited

U.S. PATENT DOCUMENTS 7,263,764 B2   9/2007   Heistand, II et al.
7,710,712 B2 *  5/2010   Takeoka .............. C04B 35/4682
                                                361/321.2

(Continued)

FOREIGN PATENT DOCUMENTS

JP         2004153043        5/2004

*Primary Examiner* — Nguyen T Ha
(74) *Attorney, Agent, or Firm* — Blakely, Sokoloff, Taylor & Zafman LLP

(57) ABSTRACT

A Non-Uniform Dielectric Layer, Multi-Layer-Ceramic-Capacitor (MLCC) has upper and lower dielectric layers separating upper and lower electrode layers, where the lower dielectric layers have a greater vertical thickness than the upper dielectric layers to reduce piezoelectric effect driven capacitor reaction forces on a printed circuit board (PCB) on which the capacitor is mounted. Such an MLCC may include an upper set of dielectric layers that separate adjacent pairs of upper electrode layers in a top portion of the MLCC, and a lower set of dielectric layers that separate adjacent pairs of lower electrode layers in a bottom portion of the MLCC. A bottom portion of the MLCC may be mounted on a PCB. The thickness of the lower dielectric layers may be between 1.5 and 3.5 times greater than the upper dielectric layers to reduce piezoelectric effect driven capacitor reaction forces in the audio range of human hearing.

20 Claims, 7 Drawing Sheets

(51) Int. Cl.
*H01G 4/005* (2006.01)
*H05K 3/34* (2006.01)

(56) References Cited

U.S. PATENT DOCUMENTS

| | | | |
|---|---|---|---|
| 8,218,287 B2 | 7/2012 | Shibue et al. | |
| 8,369,064 B2 | 2/2013 | Ichiyanagi et al. | |
| 8,638,543 B2 | 1/2014 | Ahn et al. | |
| 8,675,431 B2 * | 3/2014 | Iwai | G11C 29/702 365/200 |
| 8,675,432 B2 * | 3/2014 | Hong | G11C 29/1201 365/189.09 |
| 8,891,226 B2 * | 11/2014 | Lee | H01G 4/12 361/301.2 |
| 8,908,353 B2 * | 12/2014 | Takashima | C04B 35/4682 361/321.4 |
| 8,941,973 B2 * | 1/2015 | Kim | 29/25.41 |

* cited by examiner

US 9,330,849 B2

NON-UNIFORM DIELECTRIC LAYER CAPACITOR FOR VIBRATION AND ACOUSTICS IMPROVEMENT

This application claims the benefit of U.S. Provisional Patent Application No. 61/943,173 filed Feb. 21, 2014 entitled "NON-UNIFORM DIELECTRIC LAYER CAPACITOR FOR VIBRATION AND ACOUSTICS IMPROVEMENT".

FIELD

Embodiment of the present invention relate to a Non-Uniform Dielectric Layer, Multi-Layer-Ceramic-Capacitor (MLCC) having upper and lower dielectric layers separating upper and lower electrode layers, where the lower dielectric layers have a greater vertical thickness than the upper dielectric layers to reduce piezoelectric effect driven capacitor reaction forces on a printed circuit board (PCB) on which the capacitor is mounted.

BACKGROUND

In order to increase the capacitance of a Multi-Layer-Ceramic-Capacitor (MLCC), the number of dielectric layers in the MLCC can be increased. However, as the number of dielectric layers increases significantly, the dielectric layer thickness between two adjacent electrode layers decreases to sub micrometer scale. In some cases, the dielectric layers are made from ferroelectric electrostrictive materials, such as BaTiO3, which is layered between conductive electrode layers. As the dielectric layer thickness decreases, the voltage gradient in the dielectric layer can polarize the dielectric materials and then induce the dielectric layer to deform due to piezoelectric effects. The deformed MLCC can generate a reaction force, which acts on a PCB board upon which the MCLL is mounted. The PCB board can vibrate due to the capacitor force and induce an acoustic noise in the PCB in the human hearing range. It may be desirable to reduce this acoustic noise in electronic devices having the MLCC.

SUMMARY

Embodiment of the present invention relate to a Non-Uniform Dielectric Layer, Multi-Layer-Ceramic-Capacitor (MLCC) having upper and lower dielectric layers separating upper and lower electrode layers, where the lower dielectric layers have a greater vertical thickness than the upper dielectric layers to reduce piezoelectric effect driven capacitor reaction forces on a printed circuit board (PCB) on which the capacitor is mounted.

In some embodiments, a MLCC includes upper electrode layers in a top portion of the MLCC, with a first set of the upper electrode layers connected to a first terminal of the MLCC via an upper portion of a first conductive region that extends along a left side of the MLCC. A second set of the upper electrode layers are connected to a second terminal of the MLCC via an upper portion of a second conductive region that extends along a right side of the MLCC. A first set of dielectric layers separate the adjacent pairs of the first and second set of the upper electrode layers. Lower electrode layers in a bottom portion of the capacitor, include a first set of the lower electrode layers connected to the first terminal via a lower portion of the first conductive region, and a second set of the lower electrode layers directly connected to the second terminal via a lower portion of the second conductive region. A second set of dielectric layers separate the adjacent pairs of the first and second set of the lower electrode layers. A vertical thickness of the second set of dielectric layers is greater than a vertical thickness of the first set of dielectric layers. A bottom portion of the MLCC may be mounted on a printed circuit board (PCB).

In some cases, the vertical thickness of the second set of dielectric layers (and optionally a height of the lower portion of the MLCC) is selected to reduce a capacitor reaction force on or vibration of the PCB due to piezoelectric effects in the second set of dielectric layers due to voltage gradient reduction between the lower electrode layers. This may reduce an acoustic noise or vibration of the PCB in the human hearing range.

In certain embodiments, the lower portion has a height equal to between 20 and 25 percent of a total height of the MLCC; and wherein the vertical thickness of the second set of dielectric layers is between 1.5 and 2.5 times the vertical thickness of the first set of dielectric layers.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Multi-Layer-Ceramic-Capacitor (MLCC) is widely used on printed circuit board (PCB) in the high tech industry, especially in handheld devices. For example, such MLCCs may be used to filter out noise from power and ground signals transmitted through vias of or along traces of a PCB or of a processor package substrate. In some cases, uses may include as a decoupling capacitor to filter out AC signals from a DC signal, such as a power or ground signal.

Such MLCCs may have ferroelectric electrostrictive material dielectric layers with a thickness between two adjacent electrode layers in a sub micrometer scale. In such cases, the voltage gradient in the dielectric layer can polarize the dielectric materials and then induce the dielectric layer to deform due to piezoelectric effects. The deformed MLCC can generate a reaction force, which acts on a PCB board upon which the MCLL is mounted. The PCB board can vibrate due to the capacitor force and induce an acoustic noise in the PCB in the human hearing range. It may be desirable to reduce this acoustic noise in electronic devices having the MLCC. This reduction can allow the user to better enjoy use of the device without hearing the noise or vibration. In some cases, this reduces the noise or vibration heard by the user while listening to a phone call or audio stream. In some cases, this reduces the noise or vibration heard by a call recipient or other device connected to the user's device by a wired or wireless connection, such as for a call recipient of a phone call with the user.

Figure 1A:
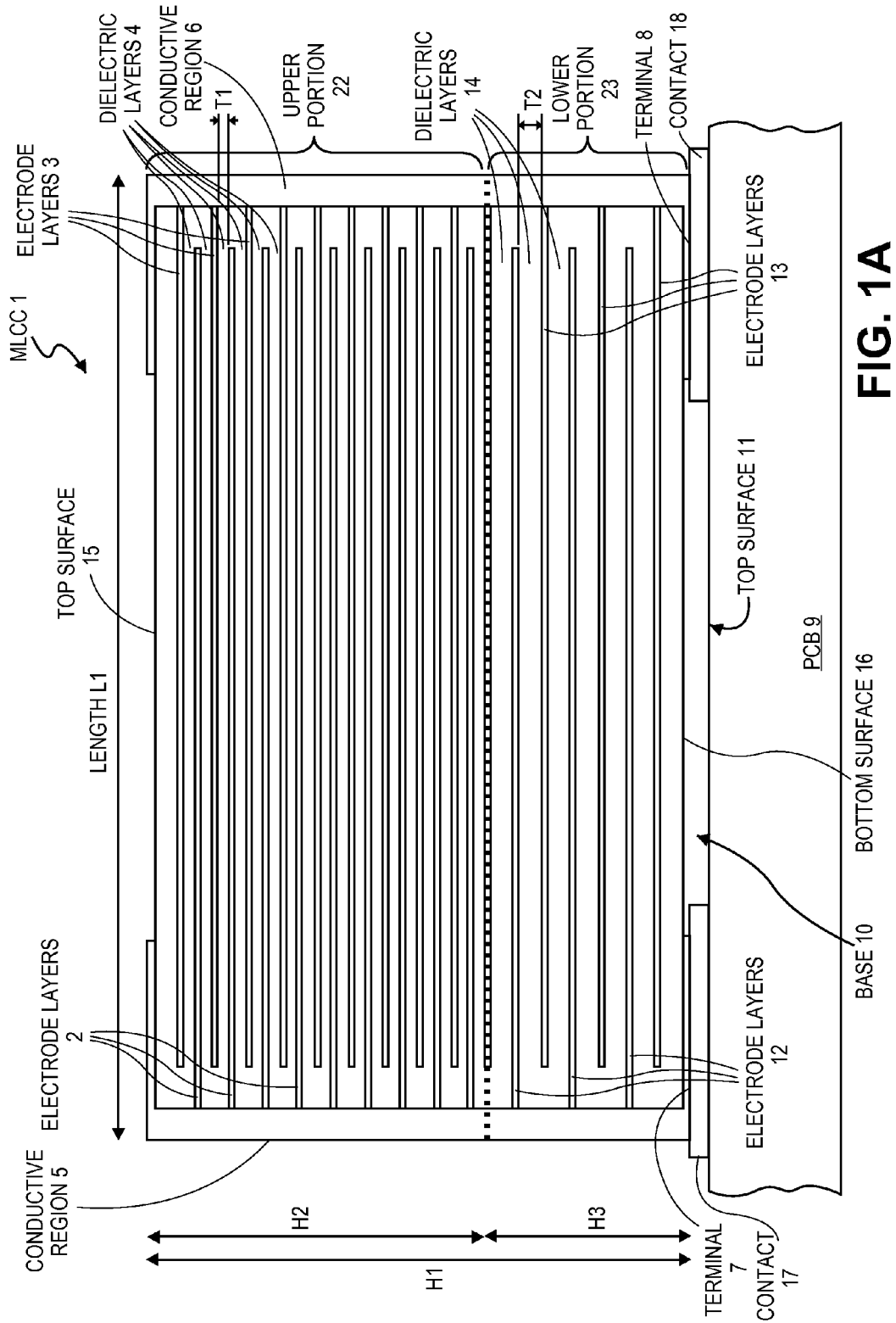
FIGS. 1A and 1B show an example of a Non-Uniform Dielectric Layer, Multi-Layer-Ceramic-Capacitor (MLCC) having upper and lower dielectric layers separating upper and lower electrode layers, where the lower dielectric layers have a greater vertical thickness than the upper dielectric layers.
Figure 1B:
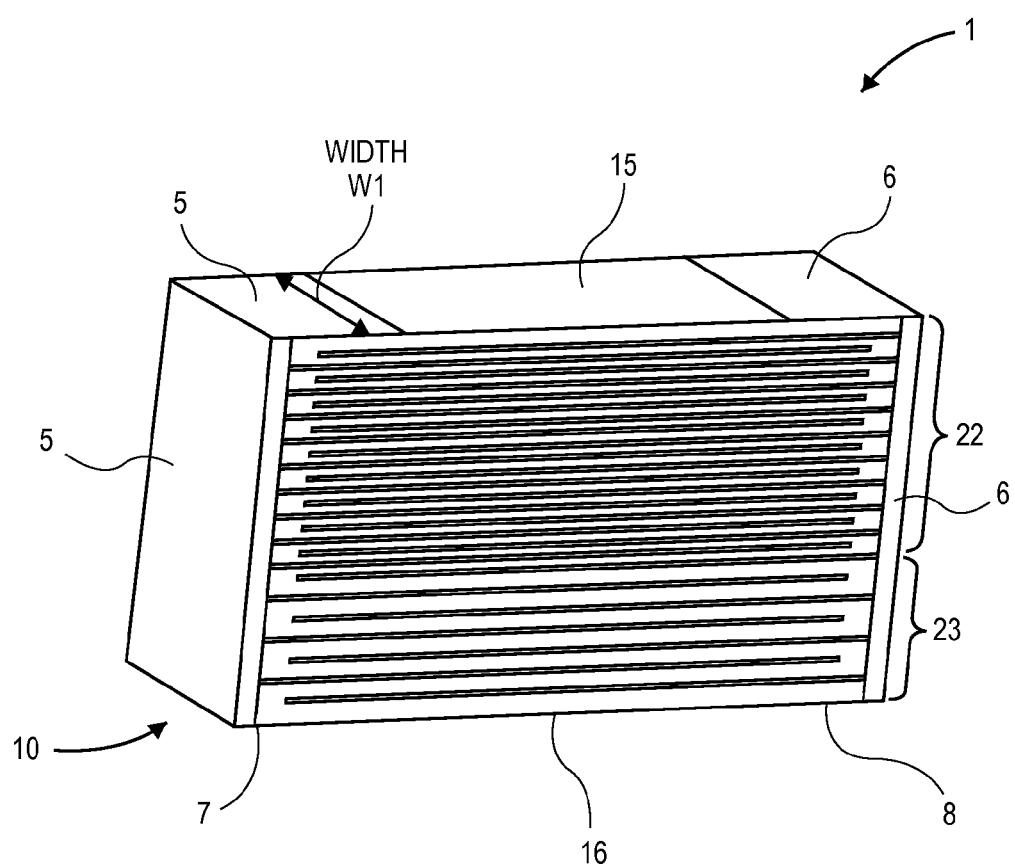

FIGS. 1A and 1B show an example of a Non-Uniform Dielectric Layer, Multi-Layer-Ceramic-Capacitor (MLCC) having upper and lower dielectric layers separating upper and lower electrode layers, where the lower dielectric layers have a greater vertical thickness than the upper dielectric layers. FIGS. 1A and 1B show MLCC 1 having first (e.g., upper) conductive electrode layers (e.g., set of layers 2 and 3) in top portion 22 of the MLCC. First set of the first electrode layers 2 are directly connected to first terminal 7 of the MLCC. This direct connection may be a direct connection via (e.g., attached or electrically connected through) an upper portion of first conductive region 5 that extends along a left side of the MLCC. In some cases, layers 2 are attached to region 5, which is attached to terminal 7. Such attachment may include attachment using solder, solder filler, resin, adhesive, by other materials, by pressure attachment, by heat attachment, by attachment during fabrication of layers of the MLCC as known in the art to attach such layers, regions and/or terminals of a MLCC. Second set of the first electrode layers 3 are directly connected to second terminal 8 of the MLCC. This direct connection may be a direct connection via an upper portion of second conductive region 6 that extends along a right side of the MLCC. In some cases, layers 3 are attached to region 6, which is attached to terminal 8. Such attachment may include attachment as described for layer 7, region 5 and terminal 7. The vertical order or sequence of layers 2 and 3 may be interleaved or alternating.

MLCC 1 has upper insulating dielectric layers 4 separating the first electrode layers (e.g., disposed between layers 2 and 3), such as by having layers 4 between pairs of the first set 2 and second set 3 of the electrode layers. Dielectric layers 1 have vertical thickness T1. In some cases, thickness T1 may be a vertical thickness between adjacent ones of electrode layers 2 and 3, such as a thickness between adjacent ones of one of layer 2 and one of layer 3. In some cases, each of layers 4, all of layers 4, or at least the top half of layers 4 have thickness T1. In some cases, MLCC 1 has upper portion 22 having one of dielectric layers 4 separating or between each pair of adjacent electrode layers 2 and 3.

In some embodiments, the conductive electrode layers 2 and 3 are attached to conductive regions 5 and 6, respectively, which are attached to terminals 7 and 8 (e.g., contacts of the capacitor), which can be electrically attached to contacts 17 and 18 of the PCB 9, respectively. Specifically, electrode layers 2 may be directly connected (e.g., touching and/or electrically conductively connected) to terminal 7 of the MLCC via conductive region 5 that extends along a left side of the MLCC. Electrode layers 3 may be directly connected (e.g., touching and/or electrically conductively connected) to terminal 8 of the MLCC via conductive region 6 that extends along a right side of the MLCC.

FIGS. 1A and 1B also show MLCC 1 having second (e.g., lower) conductive electrode layers (e.g., set of layers 12 and 13) in bottom portion 23 of the MLCC. First set of the second electrode layers 12 are directly connected to first terminal 7 of the MLCC via (e.g., attached or electrically connected through) a lower portion of first conductive region 5 that extends along a left side of the MLCC. Second set of the second electrode layers 13 are directly connected to second terminal 8 of the MLCC via a lower portion of second conductive region 6 that extends along a right side of the MLCC. The vertical order or sequence of layers 12 and 13 may be interleaved or alternating.

MLCC 1 has lower insulating dielectric layers 14 separating the second electrode layers (e.g., disposed between layers 12 and 13), such as by having layers 14 between pairs of the first set 12 and second set 13 of the electrode layers. Dielectric layers 14 have vertical thickness T2. In some cases, thickness T2 may be a vertical thickness between adjacent ones of electrode layers 12 and 13, such as a thickness between adjacent ones of one of layer 12 and one of layer 13. In some cases, each of layers 14, all of layers 14, or at least the bottom half of layers 14 have thickness T2. In some cases, MLCC 1 has lower portion 23 having one of dielectric layers 14 separating or between each pair of adjacent electrode layers 12 and 13. According to some embodiments, T2 is greater than T1.

Conductive electrode layers 2, 3, 12 and 13 may be or include electrical conductor materials such as metal, alloy, copper, gold, silver, other conductors and/or combinations thereof, such as those known in the art for MLCCs. Also, regions 5 and 6; terminals 7 and 8; and contacts 17 and 18 may also be or include electrical conductor materials such as metal, alloy, copper, gold, silver, other conductors and/or combinations thereof, such as those known in the art for MLCCs. In some cases, region 5 and terminal 7, and/or region 6 and terminal 8 are formed of the same material or are formed at the same time and of the same material. Dielectric layers 4 and 14 may be or include electrical dielectric or insulating materials such as ferroelectric electrostrictive (e.g., possibly also described as electro-constrictive) materials, BaTiO3, an X5R class dielectric, a X7R class dielectric, another dielectric, and/or combinations thereof, such as those known in the art for MLCCs. These dielectric layers may be layered between the pairs of conductive electrode layers.

In some cases, MLCC 1 only includes upper portion 22 and lower portion 23, without other electrode and dielectric layers. In some cases, upper portion 22 is the topmost portion and lower portion 23 is the bottommost portion of MLCC 1. In this case, may be no other electrode and dielectric layers above portion 22 or below portion 23.

In some cases, the difference in thickness from T2 to T1 is described as a "step change" that occurs at an interface between portions 22 and 23. Alternative embodiments consider other electrode and dielectric layers between upper portion 22 and lower portion 23. These other electrode and dielectric layers may include dielectric layers having a thickness between T1 and T2. Some cases, these other dielectric layers may have a gradient in the dielectric thickness between the upper and lower portion, such as where the thickness gradually gets greater from the top to the bottom of the capacitor of the other layers between portions 22 and 23.

In some embodiments, one of the upper dielectric layers (e.g., topmost layer of layers 4 as shown in FIG. 1A) forms top surface 15 of the MLCC, and one of the lower dielectric layers (e.g., bottommost layer of layers 14 as shown in FIG. 1A) forms bottom surface 16 of the MLCC. Surfaces 15 and 16 may be exposed to the ambient, such as prior to mounting of the MLCC on a PCB or other device. In some case, the topmost dielectric layer of MLCC 1 that forms surface 15 may have thickness T1 or T2 (or another thickness appropriate for the top dielectric layer of MLCC 1).

Embodiments consider horizontally mounting the capacitor on a PCB or other surface, such as where base 10 or bottom surface 11 is mounted on a top surface or recess of a PCB. Such mounting may include solder, solder filler, resin, adhesive, or other materials as known in the art to connect the terminals of the capacitor to contacts, traces, or terminals of a PCB. It may also include those materials to bond bottom surface 11 to the PCB, etc.

In some cases, MLCC 1 includes bottom portion 10, which is configured to be mounted on a printed circuit board (PCB). Portion 10 may include terminals 7 and 8, and surface 16, which may have bottom surfaces for attaching to contacts and top surfaces of a PCB. In some embodiments, MLCC 1 is mounted on, attached to or connected to a PCB, such as by having terminals 7 and 8 electrically attached to contacts 17 and 18 (e.g., MLCC 1 is mounted on PCB 9 as shown in FIGS. 1A and 1B). This may include having terminals 7 and 8 electrically attached to contacts 17 and 18 by soldered, conductive adhesive to otherwise. This may include having base 10 or surface 16 of MLCC 1 attached, bonded or adhered to top surface 11 of the PCB 9.

In some embodiments, the conductive electrode layers 12 and 13 are attached to conductive regions 5 and 6, respectively, which are attached to terminals 7 and 8 (e.g., contacts), which can be electrically attached to contacts 17 and 18 of the PCB 9, respectively. Specifically, electrode layers 12 may be directly connected (e.g., touching and/or electrically conductively connected) to terminal 7 of the MLCC via conductive region 5 that extends along a left side of the MLCC. Electrode layers 13 may be directly connected (e.g., touching and/or electrically conductively connected) to terminal 8 of the MLCC via conductive region 6 that extends along a right side of the MLCC.

In other embodiments, MLCC 1 is not yet mounted on, attached to or connected to a PCB or other device (e.g., MLCC 1 is not mounted on PCB 9 as shown in FIGS. 1A and 1B). For example, MLCC 1 may be a separate component being provided for assembly or mounting onto a PCB, substrate, or other electronic component.

Layers 2, region 5 and terminals 7 may be used to receive or provide an input for a first signal to upper portion 22 of MLCC 1; while, at the same time, layers 3, region 6 and terminals 8 may be used to transmit or output (e.g., provide a response for upper portion 22 of MLCC 1 to) the same first signal received at terminal 7. In parallel and at the same time, layers 12, region 5 and terminal 7 may be used to receive or provide an input for a first signal to lower portion 23 of MLCC 1; while, at the same time, layers 13, region 6 and terminal 8 may be used to transmit or output (e.g., provide a response for lower portion 23 of MLCC 1 to) the same first signal received at terminal 7. It can be appreciated that these roles of terminals 7 and 8 can be reversed.

Such a first signal may include various differences in voltage and current such as by including various DC components, AC components, and polarities that change over time. This signal and these changes may exist between the first and second plurality of electrode layers. This signal and these changes may cause voltage gradients between the first and second plurality of electrode layers.

According to embodiments, in order to increase the capacitance of a MLCC, the number of dielectric layers in the MLCC (e.g., layers 4 and 14 of MLCC 1) can be increased. However, as the number of dielectric layers increases significantly (e.g., for the same height capacitor), the dielectric layer thickness between two adjacent electrode layers decreases to sub micrometer scale. In some cases, the dielectric layers are made from ferroelectric electrostrictive materials, such as $BaTiO_3$, which is layered between conductive electrode layers. As the dielectric layer thickness decreases, the voltage gradient in the dielectric layer polarizes the dielectric materials and then induces the dielectric layer to deform (e.g., bend along the length of the layers) due to piezoelectric effects. The deformed MLCC generates a reaction force/moment, which acts on the PCB board (e.g., pushes a force into and away from PCB surface 11). Hence, the excited PCB board vibrates (e.g., in the vertical direction) due to the capacitor force/moment and induces the acoustic noise in the human hearing range (e.g., a vertical vibration in PCB 9 such as at or along surface 11).

In some instances, such vibration is transferred to the PCB by direct contact or touching of terminal 7 and/or 8 and contacts or surfaces of the PCB. In some instances, such vibration is transferred to the PCB by through solder, solder filler, resin, adhesive, or other materials as known in the art to connect the terminals of the capacitor to contacts, traces, or terminals of a PCB. In some instances, such vibration is transferred to the PCB by through materials that bond bottom surface 11 to the PCB. In some instances, such vibration is transferred to the PCB by through any two or three of the above examples.

According to some embodiments, one efficient way to reduce the acoustic noise is to reduce the capacitor reaction force due to piezoelectric effects. The reaction force by the capacitor is mostly dominant by the bottom portion of layers a MLCC (e.g., lower portion 23). So, some embodiments of MLCC 1 (e.g., as shown and described for FIGS. 1A and 1B) are a non-uniform dielectric layer thickness capacitor for vibration and acoustic improvement (e.g., reduced vertical vibration). They contains thicker dielectric layers 14 (thickness T2) at the bottom portion 23 of the capacitor to reduce the reaction force for vibration and provide acoustic improvement, and the regular dielectric layers 4 (thickness T1) at the top portion 22 of the capacitor for greater capacitance purpose. Such embodiments may have lower dielectric layers having a vertical thickness T2 between 1.5 and 3.5 times thickness T1 of the upper dielectric layers to reduce piezoelectric effect driven capacitor reaction forces on a printed circuit board (PCB) on which the capacitor is mounted. Such embodiments may include where T2 is at least 50% greater than T1. Thicker dielectric layers 14 reduce the reaction force for vibration and provide acoustic improvement due to their increased thickness reducing the voltage gradient polarized deformation of the dielectric layers due to piezoelectric effects. The resultant non-uniform capacitor 1 has a significantly higher voltage rating without sacrificing an appreciable amount of capacitance, i.e., the voltage rating is improved.

More specifically, referring to FIGS. 1A and 1B, lower dielectric layers 14 may have a greater vertical thickness (T2) than a thickness (T1) of the upper dielectric layers 4, such as to reduce piezoelectric effect driven capacitor reaction forces on printed circuit board (PCB) 9 on which the capacitor is mounted. According to some embodiments, lower dielectric layers 14 have a greater vertical thickness (T2) than a thickness (T1) of the upper dielectric layers 4, such as to provide a larger range of frequency resonance or filtering for (e.g., between input and output of) MLCC 1. For example, the frequency response or electrical characteristics of MLCC 1 may be the combination or addition of that of the upper and lower portion. In addition, it is noted that the capacitance of MLCC 1 is the addition (e.g., aggregate) of the capacitance of the upper and lower portion since the upper and lower portion are electrically in parallel.

In some cases, embodiments may result in a higher voltage rating for all other things the same (e.g., number of capacitor layers), without sacrificing more than between 10 and 20 percent of the capacitance of the MLCC. In some cases, the voltage rating increases with increasing H3 and/or T2.

In some cases, portion 22 may have height H2 and portion 23 may have height H3. According to embodiments, width W1 may be approximately 1 mm. In some cases, height H1 may be approximately 0.6 mm. In some cases, height H3 may be 20 to 25% of height H1. In some cases, thickness T1 may be between 0.5 and 3 microns (e.g., ×10E-6 meters). In some cases, thickness T2 may be between 1 and 6 microns. Some embodiments may include all 4 examples above. In some cases, thickness T2 may be between 2 and 3 times the thickness of T1.

According to embodiments, MLCC 1 may have between 300 and 400 total layers (e.g., for portion 22 and 23) of dielectric. This may include the sum of the number of layers 4 and 14. In some cases, MLCC 1 may have between 350 and 600 total layers of dielectric.

In some cases, the ratio of H3 to H1, the ratio of thickness T1 to T2, and the number of layers in the upper and lower portion of the MLCC are factors to be considered in determining the reduction in audio vibration in the PCB due to the MLCC. Also, the ratio of height H3 to H1; width W1, height H1, and length L1 of the capacitor; the desired capacitance; and the desired frequency response of the capacitor may be factors for considering the ratio of thickness T2 to T1.

Figure 2A:
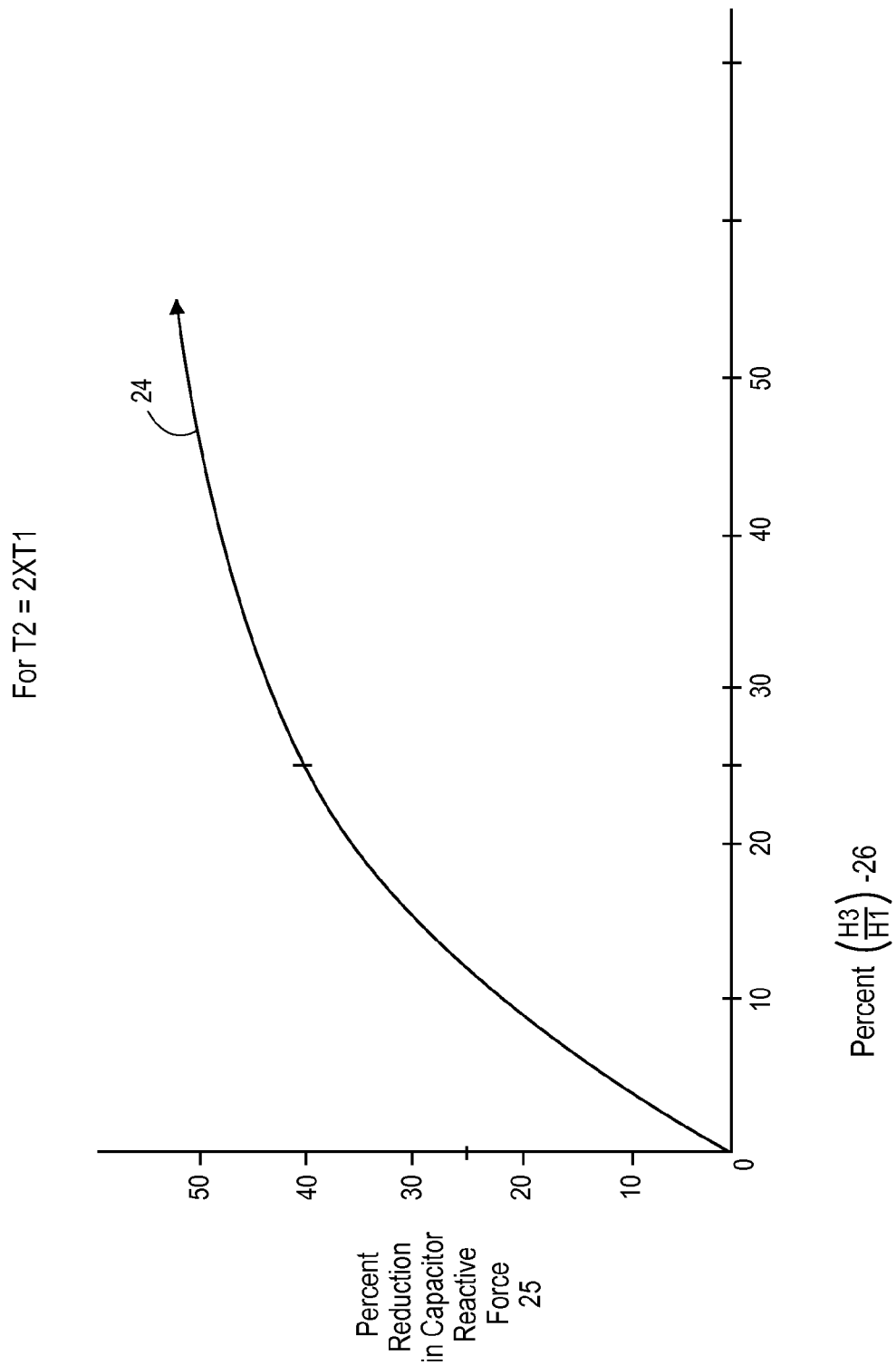
FIG. 2A is an example of a plot of Reduction in Capacitor Reaction Force versus the percentage of height H3 of the lower portion to total height H1 of a Non-Uniform Dielectric Layer MLCC.

The difference in height H3 as compared to height H2 can be a factor for reducing audio vibration in the PCB due to the MLCC. FIG. 2A is an example of a plot of Reduction in Capacitor Reaction Force (e.g., in the audio frequency vibration of the PCB) versus the percentage of height H3 of the lower portion to total height H1 of a Non-Uniform Dielectric Layer MLCC. FIG. 2A shows plot 24 of percent reduction in capacitor reactive force (CRF) 25 versus the percent (H3/H1) 26. CRF may be a force upon which audio vibration in the PCB is based or proportional. Plot 24 may be an estimated or predicted measurement of force 25 for vibrations in an audio range. In some cases, plot 24 may show an actual or peak measurement obtained by experimentation.

The CRF may exist or be described as a force between base 10 and surface 11 due to piezoelectric effects in dielectric layers 14 from voltage differences or polarity changes (e.g., AC in signals) at or between the second plurality of electrode layers 12 and 13. Such a CRF may exist or be described as a force between terminal 7 and/or 8 and contacts or surfaces of the PCB; through solder, solder filler, resin, adhesive, or other materials as known in the art to connect the terminals of the capacitor to contacts, traces, or terminals of a PCB; and/or through materials that bond bottom surface 11 to the PCB (e.g., surface 11) due to piezoelectric effects.

Plot 24 may be for an embodiment of an MLCC 1 where thickness T2 is twice thickness T1. Plot 24 is shown having a reduction of approximately 40%, where H3 is 25% or ¼ of the total of height H1.

In some cases, for reduction in audio vibration of between 10 and 30% of the PCB, H3 may be 25% of H1. In some cases, for a reduction in audio vibration of between 40 and 50% of the PCB, H3 may be between 25% of H1.

Figure 2B:
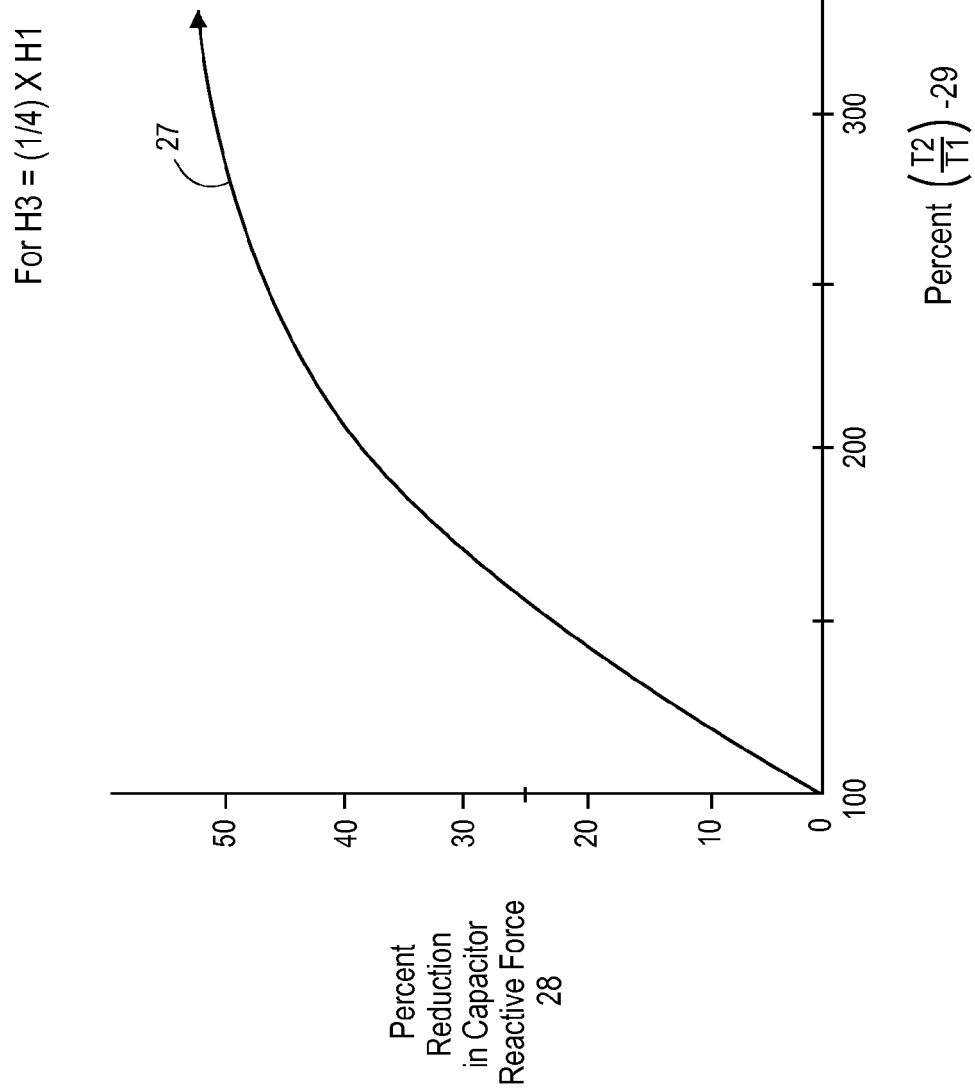
FIG. 2B is an example of a plot of Reduction in Capacitor Reaction Force versus the percentage of thickness T2 of lower portion dielectric layers to thickness T1 of the upper portion dielectric layers of a Non-Uniform Dielectric Layer MLCC.

Similarly, the difference in thickness T2 as compared to thickness T1 may be a factor for reducing audio vibration in the PCB due to the MLCC. FIG. 2B is an example of a plot of Reduction in Capacitor Reaction Force (e.g., in the audio frequency vibration of the PCB) versus the percentage of thickness T2 of lower portion dielectric layers to thickness T1 of the upper portion dielectric layers of a Non-Uniform Dielectric Layer MLCC. FIG. 2B shows plot 27 of percent reduction and capacitor reactive force, CRF 28 versus percent (T2/T1) 29. Force 28 may be a force (e.g., a force between base 10 and surface 11 that is estimated, measured or otherwise) similar to the descriptions above for force 25.

FIG. 2B may be for a situation where height H3 is 25% or ¼ of height H1. Plot 27 shows a percent reduction of approximately 50% where T2 is three times the thickness of T1. Plot 27 also shows a reduction of approximately 40% where thickness T2 is twice thickness T1.

Thickness T2 may be between 1.5 and 3.5 times the thickness of thickness T1. In some cases, T2 may be between 1.5 and 2.5 times, or between 2 and 3 times the thickness of thickness T1. For T2 that is 2 times the thickness of thickness T1 the vibration (e.g., CRF 28) may be reduced by 40%. For T2 that is 3 times the thickness of thickness T1 the vibration (e.g., CRF 28) may be reduced by 50%. However, these may be offset by the reduction in capacitance in portion 23 as compared to a same height of portion 22. For example, when T2 is two times T1, the capacitance of portion 23 may be 10% less than that of portion 22, for an equal thickness of the portions.

According to embodiments, between 75 and 80% of the capacitance of the MLCC for noise or vibration in the 1 to 10 kHz, or 1 to 20 kHz audio frequency range is in upper portion 22, such as when the capacitor is used to decouple a DC signal from AC noise, in that range. Here however, only the other 25 to 20 percent of the capacitance in the audio range is in the lower portion 23.

In other words, top portion 22 decouples an AC signals in the audio range, while lower portion 23 does not or does to a minor extent. Thus, the audio range is decoupled from the DC signal output by the MLCC, but the vibration at that frequency, upon the PCB is reduced by approximately 40%, due to the existence of bottom portion 23 of the capacitor. Consequently, embodiments may be described as a capacitor having a dual resonance peak for frequencies based on a thickness T1 and T2, where the peak for T1 is in the audio range, but the peak for T2 is not.

In some cases, T2 is (and optionally H3 are) selected to reduce a capacitor reaction force due to piezoelectric effects in the second plurality of dielectric layers 14 from voltage differences or polarity changes (e.g., AC in signals) at or between the second plurality of electrode layers 12 and 13. In some cases, T2 is (and optionally H3 are) selected to reduce a vibration in the PCB due to the capacitor force in dielectric layers 14 from voltage differences or polarity changes (e.g., AC in signals) at or between the second plurality of electrode layers 12 and 13, inducing an acoustic noise in the human hearing range into the PCB. In some cases, T2 is (and optionally H3 are) selected to reduce a voltage gradient in the second dielectric layers (e.g., layers 12 and 13) from voltage differences or polarity changes (e.g., AC in signals) at or between the second plurality of electrode layers 12 and 13. In some cases, T2 is (and optionally H3 are) selected to reduce a deformation of the dielectric layers 14 due to piezoelectric effects in dielectric layers 14 from voltage differences or polarity changes (e.g., AC in signals) at or between the second plurality of electrode layers 12 and 13.

In some embodiments, bottom portion 23 has a height H3 equal to between 20 and 25 percent of a total height of the MLCC H1. In some embodiments, second thickness T2 is between 1.5 and 2.5 times the first thickness T1. In some cases, the two embodiments above are combined. In some embodiments, bottom portion 23 has a height H3 equal to 25 percent of H1; and thickness T2 is between 2 times thickness T1.

Figure 3:
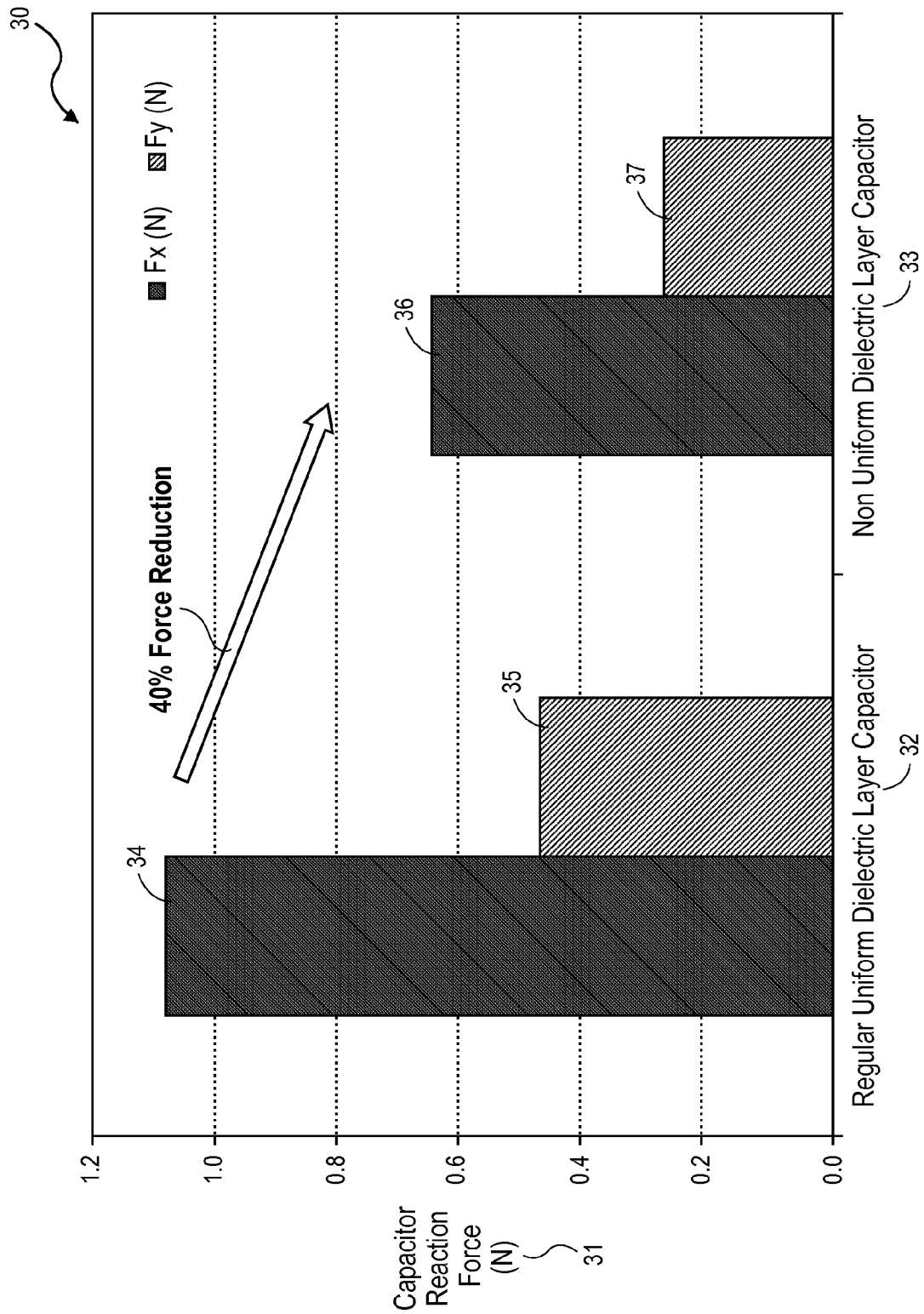
FIG. 3 shows an example of Capacitor Reaction Force for an example of a regular uniform dielectric layer capacitor and an example of a Non-Uniform Dielectric Layer MLCC.
Figure 4:
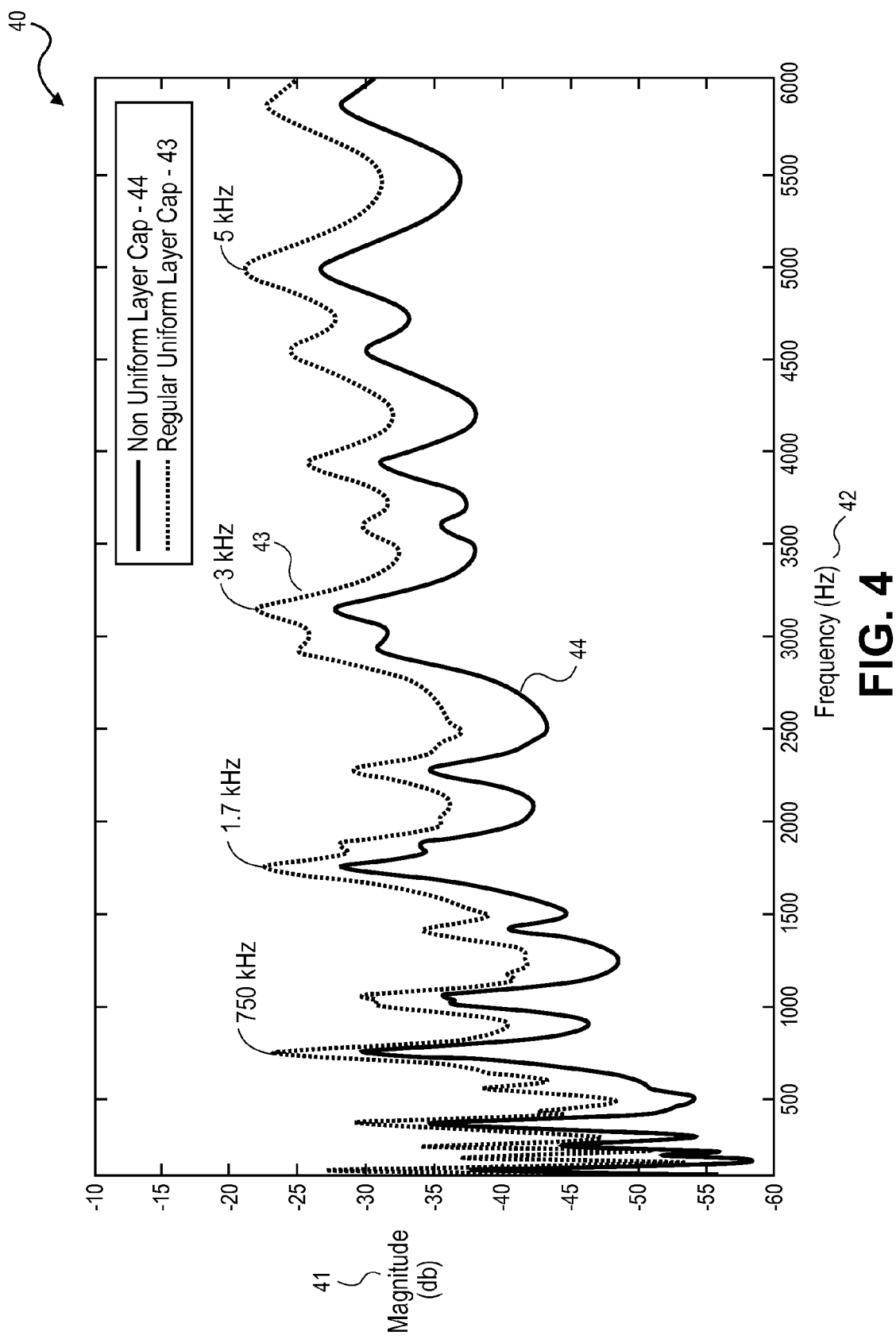
FIG. 4 shows an example of PCB board frequency response for an example of a regular uniform dielectric layer capacitor and an example of a Non-Uniform Dielectric Layer MLCC.

The simulation results shown in FIGS. 3-4 show examples that the nonuniform dielectric layer capacitor (e.g., embodiments of MLCC 1) can reduce 40% more reaction force and then reduce the PCB board vibration and acoustic nose. In some case, the best vibration and acoustic performance improvement can be achieved by optimization of the bottom portion dielectric layer configuration (e.g., a combination of selecting H3/H1 and T2/T1).

FIG. 3 shows an example of Capacitor Reaction Force for an example of a regular uniform dielectric layer capacitor and an example of a Non-Uniform Dielectric Layer MLCC. FIG. 3 shows a graph of Capacitor Reaction Force (CRF) 31 versus an example of a regular uniform dielectric layer capacitor and a non-uniform dielectric capacitor. Such a CRF (e.g., force 31) may be a force (e.g., a force between base 10 and surface 11 that is estimated, measured or otherwise) similar to the descriptions above for force 25.

In such an example, the regular uniform dielectric layer capacitor 32 may be similar to MLCC 1, except be a capacitor having only dielectric layers 4 (e.g., thickness T1) throughout a total height H1 of the capacitor. The non-uniform dielectric capacitor 33 may be represented by embodiments described for MLCC 1.

FIG. 3 shows reaction forced 31 in Newtons (N) as compared to regular capacitor 32 and non-uniform capacitor 33. For regular capacitor 32, bar graph 34 shows the reaction force in the X direction to be approximately 1.1 Newtons, and bar graph 35 shows the force in the Y direction to be approximately 0.45 Newtons. The X direction is presumed to be from left to right or the width of the capacitor as (e.g., length L1) shown in FIGS. 1A and 1B; while the Y direction is presumed to be the width or direction into the page (e.g., width W1) of FIGS. 1A and 1B.

FIG. 3 shows force 31 for the non-uniform capacitor 33 having force of bar graph 36 shown as approximately 0.65N in the X direction, and force of bar graph 37 shown as approximately 0.3N in the Y direction. It can be appreciated that the difference between the forces in the X direction is approximately 40% less for force 36 as compared to force 34.

It can be appreciated that for the forces in the Y direction, force 37 is approximately 40% less than force 35. Thus, according to some embodiments, use of the non-uniform dielectric layer capacitor, or a capacitor having a second plurality of dielectric layers, that have a thickness greater than a thickness of the first plurality, as described herein, may provide a 40% force reduction in both the X and Y directions. It can be appreciated that such a reduction in force may led to a 40% reduction in the reaction force, which acts upon the PCB board and a 40% reduction in a force that pushes into an away from surface 11 of the PCB board. Hence, this reduction may result in about a 40% reduction of vibration of the PCB board, due to the capacitor force (e.g. force 31), and may result in a significant reduction in the acoustic noise in the human hearing range induced from the force 31 and/or board vibration that results from force 31.

FIG. 4 shows an example of PCB board frequency response for an example of a regular uniform dielectric layer capacitor and an example of a Non-Uniform Dielectric Layer MLCC. FIG. 4 shows graph 40 plotting the PCB board frequency response for a non-uniform layer capacitor as compared to a regular uniform layer capacitor. PCB board frequency response may be to measure the board vibration reaction due to the capacitor's reaction force. The capacitor can excite many PCB board modes (e.g., frequencies or frequency peaks). The PCB board frequency response may illustrate which board mode is more critical due to capacitor excitation. FIG. 4 shows capacitor can excite the critical PCB board mode at 750 Hz, 1.7 KHz, 3 KHz, and 5 KHz, which are the modes with higher sound pressure levels.

Plot 40 shows magnitude 41 in Decibels (db), as compared to frequency 42 in db. The magnitude for a regular uniform layer capacitor is shown by plot 43, while the magnitude for a non-uniform layer capacitor is shown by plot 44. This can be seen, the magnitude for 44 is approximately 5 db less for a non-uniform layer capacitor, as compared to plot 43.

Consequently, this reduction may result in a 40% reduction of vibration of the PCB board, due to the magnitude (e.g., plot 44 over the frequency range), and may result in a 40% reduction in the acoustic noise in the human hearing range induced from the magnitude 44 and/or board vibration that results from magnitude 44.

Thus, embodiments have been described for providing devices of, systems including, and methods of forming and/or using a Non-Uniform Dielectric Layer MLCC. For example, such a system may include MLCC 1 mounted on PCB 9. In some cases, such a method of forming a MLCC (e.g., MLCC 1) may include: forming first electrode layers in top portion 22 including forming layers 2 directly connected to terminal 7 (e.g., via region 5) and forming layers 3 directly connected to terminal 8 (e.g., via region 6); forming dielectric layers 4 separating the first electrode layers, wherein layers 4 have a vertical thickness T1 between adjacent ones of the first electrode layers; forming second electrode layers in lower or bottom portion 23 including forming layers 12 directly connected to terminal 7 (e.g., via region 5) and forming layers 13 directly connected to terminal 8 (e.g., via region 6); and forming dielectric layers 14 separating the second electrode layers, wherein layers 14 have a vertical thickness T2 between adjacent ones of the second electrode layers, wherein T2 is greater than T1. In some cases, forming such and MLCC may include selecting T1 and T2 to reduce a capacitor reaction force due to piezoelectric effects in layers 14 caused by or from the second electrode layers. In some cases, forming such and MLCC may include that one of layers 4 forms a top surface of the MLCC; and/or that one of layers 14 forms a bottom surface of the MLCC. In some cases, forming such an MLCC (or a system including MLCC 1) may include attaching the bottom surface or portion of the MLCC to a PCB (e.g., PCB 9), such as by attaching terminal 7 to contact 17, and attaching terminal 8 to contact 18. In some cases, such attaching may include (1) directly connecting layers 2 and 12 to terminal 7 via region 5; and (2) directly connecting layers 3 and 13 to terminal 8 via region 6. In some cases, forming such and MLCC may include selecting T2 to reduce a vibration in the PCB due to the capacitor force in layers 14 inducing an acoustic noise in the human hearing range. In some cases, forming such and MLCC may include (1) selecting T2 to reduce a voltage gradient in layers 14; and/or (2) selecting T2 to reduce a deformation of layers 14 due to piezoelectric effects in layers 14.

The embodiments provide benefits such as reducing instance of or avoiding the reactive force on a PCB board due to signals flowing through the MLCC, such as a force due to the piezoelectric forces caused by polarized ceramic or other dielectric materials in a capacitor, when such materials move or press upwards and downwards with a force, such as in response to an AC signal; a signal that increases or decreases in voltage; a signal that changes polarity; and the like. In some cases, the MLCC is considered to be discreet capacitors, such as a capacitor which is not part of the layers of a substrate or PCB, but is (or is to be) mounted on, soldered to, or otherwise attached to such a substrate or PCB.

The embodiments may also provide benefits such as reducing the vibration of the substrate or PCB (upon which the MLCC is mounted) resulting from the force on the substrate or PCB due to the piezoelectric forces, such as to reduce a vibration or acoustic, or audio signal or noise in the human hearing range, such as between 1 Hz and 10 kHz. The embodiments may also provide benefits such as reducing audio frequency "ring", or "tuning out" audio resonance and vibration, within the human hearing range, such as at frequencies of less than 20 kHz.

Benefits of MLCC 1 include use of both layers 4 and 14 to provide active capacitance, such as parallel capacitive characteristics at terminals 7 and 8 for the capacitor. Benefits may also include using the lower portion dielectric layers and electrode layers to provide a varied capacitance electrical resonance frequency as compared to the upper layers.

The embodiments may also provide benefits such as not providing a MLCC that absorbs or resonates to many different frequencies (e.g., a large range of frequencies) outside of the audio range, but instead has a top portion that absorbs or resonates to frequencies including those in the audio range, and a bottom portion that absorbs or resonates to a frequency (or a number of frequencies) that are below (or optionally above) the audio range. In some cases, embodiments provide an MLCC bottom portion that "tunes out" or does not absorb (or cause a force on the PCB) in the frequency range of between 10 Hz and 10 kHz, or between 10 Hz and 20 kHz.

Embodiments of the invention can be applied to capacitors used in circuitry for filtering or otherwise passing various signals including power supply signals, AC signals, and DC bias signals. They can also be used in capacitors for handheld devices such as cellular phones, pad computers, and portable computers. They can also be used in capacitors for larger devices such as personal computers, client computers, and server computers.

Figure 5:
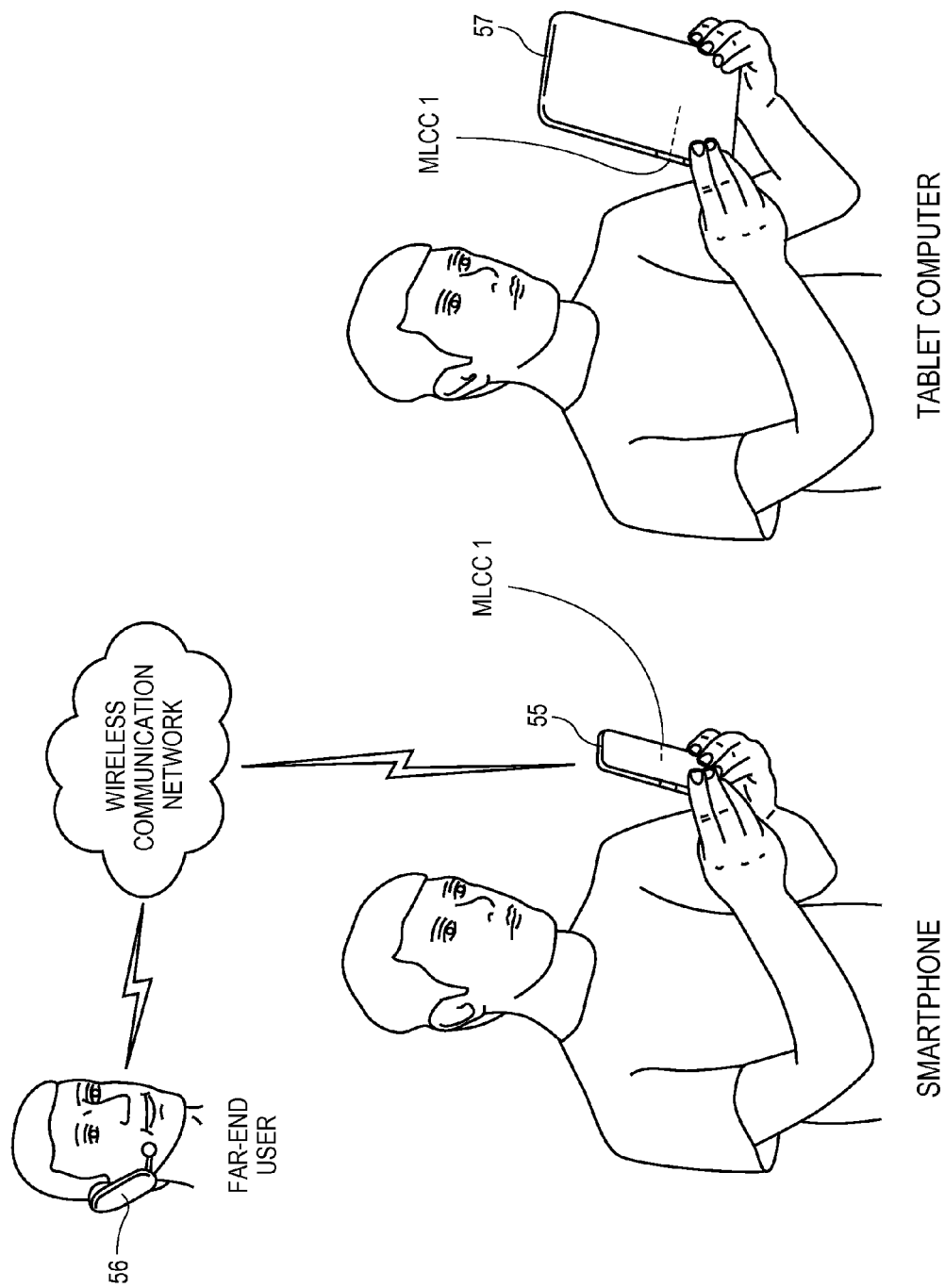
FIG. 5 shows an example of instances of portable consumer electronics devices in which embodiments of a Non-Uniform Dielectric Layer MLCC may be implemented.

To conclude, various aspects of a Non-Uniform Dielectric Layer MLCC have been described. As explained above, an embodiment of the invention may be housed in a portable device such as a mobile telephone communications device, a smart phone, a personal digital media player, a tablet computer, a notebook computer, and a compact desktop. For example, FIG. 5 depicts instances of portable consumer electronics devices in which embodiments of the invention may be implemented. As seen in FIG. 5, the Non-Uniform Dielectric Layer MLCC may be included in a speakerphone unit that is integrated within a consumer electronic device 55 such as a smart phone with which a user can conduct a call with a far-end user of a communications device 56 over a wireless communications network. In another example, the Non-Uniform Dielectric Layer MLCC may be mounted to a PCB that is integrated within the housing of tablet computer 57. These are just examples of where the Non-Uniform Dielectric Layer MLCC may be used, it is contemplated, however, that the Non-Uniform Dielectric Layer MLCC may be used with any type of electronic device in which it is desired to have a Non-Uniform Dielectric Layer MLCC, such as in a lap top computing device or portable headset such as device 56.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. For example, although embodiments of the Non-Uniform Dielectric Layer MLCC described in FIGS. 1-5 include terminals 7 and 8 for direct horizontal mounting on PCB, other materials, layers, solder, adhesive, or electronic devices may exist between terminals 7 and 8 and contacts of the PCB. The description is thus to be regarded as illustrative instead of limiting.

What is claimed:

1. A Multi-Layer-Ceramic-Capacitor (MLCC), comprising:
   a first plurality of electrode layers in a top portion of the MLCC, a first set of the first plurality of electrode layers directly connected to a first terminal of the MLCC, and a second set of the first plurality of electrode layers directly connected to a second terminal of the MLCC;
   a first plurality of dielectric layers separating the first plurality of electrode layers, wherein the first plurality of dielectric layers have a first vertical thickness between adjacent ones of the first plurality of electrode layers;
   a second plurality of electrode layers in a bottom portion of the capacitor, a first set of the second plurality of electrode layers directly connected to the first terminal, and a second set of the second plurality of electrode layers directly connected to the second terminal;
   a second plurality of dielectric layers separating the second plurality of electrode layers, wherein the second plurality of dielectric layers have a second vertical thickness between adjacent ones of the second plurality of electrode layers;
   wherein the second vertical thickness is greater than the first vertical thickness.

2. The MLCC of claim 1, wherein the first and second vertical thicknesses are selected to reduce a capacitor reaction force due to piezoelectric effects in the second plurality of dielectric layers from the second plurality of electrode layers.

3. The MLCC of claim 1, wherein one of the first plurality of dielectric layers forms a top surface of the MLCC; wherein one of the second plurality of dielectric layers forms a bottom surface of the MLCC; and wherein the bottom portion is configured to be mounted on a printed circuit board (PCB).

4. The MLCC of claim 3, wherein the first terminal is attached to a first contact of the PCB, wherein the second terminal is attached to a second contact of the PCB, and wherein the second vertical thickness is selected to reduce a vibration in the PCB due to a capacitor reaction force, in the second plurality of dielectric layers from the second plurality of electrode layers, inducing an acoustic noise in the human hearing range.

5. The MLCC of claim 1, wherein the second vertical thickness is selected to reduce a voltage gradient in the second plurality of dielectric layers from the second plurality of electrode layers.

6. The MLCC of claim 1, wherein the second vertical thickness is selected to reduce a deformation of the second plurality of dielectric layers due to piezoelectric effects in the second plurality of dielectric layers from the second plurality of electrode layers.

7. The MLCC of claim 1, wherein the bottom portion has a height equal to between 20 and 25 percent of a total height of the MLCC; and wherein the second vertical thickness is between 1.5 and 2.5 times the first vertical thickness.

8. The MLCC of claim 1, wherein the first set of the first plurality of electrode layers are directly connected to the first terminal of the MLCC via a first conductive region that extends along a left side of the MLCC; wherein the second set of the first plurality of electrode layers are directly connected to the second terminal of the MLCC via a second conductive region that extends along a right side of the MLCC; wherein the first set of the second plurality of electrode layers are directly connected to the first terminal via the first conductive region; and wherein the second set of the second plurality of electrode layers are directly connected to the second terminal via the second conductive region.

9. A system comprising:
a printed circuit board (PCB);
A Multi-Layer-Ceramic-Capacitor (MLCC) mounted on the PCB, the MLCC comprising:
a first plurality of electrode layers in a top portion of the MLCC, a first set of the first plurality of electrode layers directly connected to a first terminal of the MLCC, and a second set of the first plurality of electrode layers directly connected to a second terminal of the MLCC;
a first plurality of dielectric layers separating the first plurality of electrode layers, wherein the first plurality of dielectric layers have a first vertical thickness between adjacent ones of the first plurality of electrode layers;
a second plurality of electrode layers in a bottom portion of the capacitor, a first set of the second plurality of electrode layers directly connected to the first terminal, and a second set of the second plurality of electrode layers directly connected to the second terminal;
a second plurality of dielectric layers separating the second plurality of electrode layers, wherein the second plurality of dielectric layers have a second vertical thickness between adjacent ones of the second plurality of electrode layers;
wherein the second vertical thickness is greater than the first vertical thickness.

10. The system of claim 9, wherein the first and second vertical thicknesses are selected to reduce a capacitor reaction force due to piezoelectric effects in the second plurality of dielectric layers from the second plurality of electrode layers.

11. The system of claim 9, wherein one of the first plurality of dielectric layers forms a top surface of the MLCC; wherein one of the second plurality of dielectric layers forms a bottom surface of the MLCC; and wherein the bottom portion is mounted on the PCB.

12. The system of claim 11, wherein the first terminal is attached to a first contact of the PCB, wherein the second terminal is attached to a second contact of the PCB, and wherein the second vertical thickness is selected to reduce a vibration in the PCB due to a capacitor reaction force, in the second plurality of dielectric layers from the second plurality of electrode layers, inducing an acoustic noise in the human hearing range.

13. The system of claim 9, wherein the second vertical thickness is selected to reduce a voltage gradient in the second plurality of dielectric layers from the second plurality of electrode layers.

14. The system of claim 9, wherein the first set of the first plurality of electrode layers are directly connected to the first terminal of the MLCC via a first conductive region that extends along a left side of the MLCC; wherein the second set of the first plurality of electrode layers are directly connected to the second terminal of the MLCC via a second conductive region that extends along a right side of the MLCC; wherein the first set of the second plurality of electrode layers are directly connected to the first terminal via the first conductive region; and wherein the second set of the second plurality of electrode layers are directly connected to the second terminal via the second conductive region.

15. A method of forming a Multi-Layer-Ceramic-Capacitor (MLCC), comprising:
forming a first plurality of electrode layers in a top portion of the MLCC, a first set of the first plurality of electrode layers directly connected to a first terminal of the MLCC;
forming a second set of the first plurality of electrode layers directly connected to a second terminal of the MLCC;
forming a first plurality of dielectric layers separating the first plurality of electrode layers, wherein the first plurality of dielectric layers have a first vertical thickness between adjacent ones of the first plurality of electrode layers;
forming a second plurality of electrode layers in a bottom portion of the capacitor, a first set of the second plurality of electrode layers directly connected to the first terminal;
forming a second set of the second plurality of electrode layers directly connected to the second terminal;
forming a second plurality of dielectric layers separating the second plurality of electrode layers, wherein the second plurality of dielectric layers have a second vertical thickness between adjacent ones of the second plurality of electrode layers;
wherein the second vertical thickness is greater than the first vertical thickness.

16. The method of claim 15, further comprising selecting the first and second vertical vertical thicknesses to reduce a capacitor reaction force due to piezoelectric effects in the second plurality of dielectric layers from the second plurality of electrode layers.

17. The method of claim 15, wherein one of the first plurality of dielectric layers forms a top surface of the MLCC; wherein one of the second plurality of dielectric layers forms a bottom surface of the MLCC; and further comprising:
attaching the bottom portion to a printed circuit board (PCB).

18. The method of claim 17, wherein attaching comprises:
attaching the first terminal to a first contact of the PCB;
attaching the second terminal to a second contact of the PCB; and further comprising:
selecting the second vertical thickness to reduce a vibration in the PCB due to a capacitor reaction force, in the second plurality of dielectric layers from the second plurality of electrode layers, inducing an acoustic noise in the human hearing range.

19. The method of claim 15, further comprising one of (1) selecting the second vertical thickness to reduce a voltage gradient in the second plurality of dielectric layers from the second plurality of electrode layers; or (2) selecting the second vertical thickness to reduce a deformation of the second plurality of dielectric layers due to piezoelectric effects in the second plurality of dielectric layers from the second plurality of electrode layers.

20. The method of claim 15, further comprising:
directly connecting the first set of the first plurality of electrode layers to the first terminal of the MLCC via a first conductive region that extends along a left side of the MLCC;
directly connecting the second set of the first plurality of electrode layers to the second terminal of the MLCC via a second conductive region that extends along a right side of the MLCC;
directly connecting the first set of the second plurality of electrode layers to the first terminal via the first conductive region; and
directly connecting the second set of the second plurality of electrode layers to the second terminal via the second conductive region.

* * * * *